(12) United States Patent
Wong et al.

(10) Patent No.: US 6,717,203 B2
(45) Date of Patent: Apr. 6, 2004

(54) COMPACT NONVOLATILE MEMORY USING SUBSTRATE HOT CARRIER INJECTION

(75) Inventors: Ting-Wah Wong, Cupertino, CA (US); Kelvin Yupak Hui, Fremont, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/192,310

(22) Filed: Jul. 10, 2002

(65) Prior Publication Data

US 2004/0007732 A1 Jan. 15, 2004

(51) Int. Cl.[7] .............................................. H01L 29/788
(52) U.S. Cl. ....................................... 257/315; 257/378
(58) Field of Search .................................. 257/315, 378

(56) References Cited

U.S. PATENT DOCUMENTS

| | | | |
|---|---|---|---|
| 4,429,326 A | 1/1984 | Watanabe et al. ............. 357/43 |
| 5,867,425 A | 2/1999 | Wong ..................... 365/185.08 |
| 5,896,315 A | 4/1999 | Wong ..................... 365/185.01 |
| 5,912,488 A | 6/1999 | Kim et al. ................... 257/316 |
| 6,091,634 A | 7/2000 | Wong ..................... 365/185.14 |
| 6,125,060 A | * 9/2000 | Chang .................... 365/185.29 |
| 2002/0033499 A1 | * 3/2002 | Esseni et al. ................ 257/315 |

\* cited by examiner

*Primary Examiner*—David Nelms
*Assistant Examiner*—Tu-Tu Ho

(57) ABSTRACT

A triple poly nonvolatile memory cell which is highly scalable includes a cell formed in a triple well. A select transistor can have a source which also acts as the emitter of a lateral bipolar transistor. The lateral bipolar transistor operates as a charge injector. The charge injector may provide electrons for substrate hot electron injection of electrons onto the floating gate for programming. The select transistor may include a gate formed as a self-aligned sidewall spacer on said sense transistor.

4 Claims, 6 Drawing Sheets

COMPACT NONVOLATILE MEMORY USING SUBSTRATE HOT CARRIER INJECTION

BACKGROUND

This invention relates generally to nonvolatile memories and particularly to electrically erasable nonvolatile memories.

Nonvolatile memory cells are advantageous since they retain recorded information even when the power to the memory is turned off. There are several different types of nonvolatile memories including erasable programmable read only memories (EPROMs), electrically erasable and programmable read only memories (EEPROMs) and flash EEPROM memories. EPROMs are erasable through light exposure but are electrically programmable by channel hot electron injection onto a floating gate. Conventional EEPROMs have the same programming functionality, but instead of being light erasable they can be erased and programmed by electron tunneling. Thus, information may be stored in these memories, retained when the power is off, and the memories may be erased for reprogramming, as necessary, using appropriate techniques. Flash EEPROMs may be block erased, typically giving them better read access times than regular EEPROMs.

Currently, flash memories have gained considerable popularity. For example, flash memories are often utilized to provide on-chip memory for microcontrollers, modems and SMART cards and the like where it is desirable to store codes that may need fast updating.

While flash memories and EEPROMs are closely related, in many instances, flash memories are preferred because their smaller cell size means that they can be made more economically. However, flash memories and EEPROMs often have very similar cell attributes.

Particularly with an EEPROM, the electrical programming of the cells normally requires substantial potentials to be applied to the cells. These potentials induce electron tunneling from an N+ region onto the floating gate. Additional complexity may arise from the need to provide substantially larger voltages to memory cells than are needed for normal transistor operation.

Furthermore, with the conventional flash EEPROMs, the electrical programming of the cells normally requires high current to be applied to the cells. A very minute amount of this electron current becomes injected from the drain depletion region onto the floating gate. This means that the injection efficiency of such devices is low (e.g., $1 \times 10^{-6}$ to $1 \times 10^{-9}$). The requirement of high current adds additional complexity because of the design of the high current pump operated at low voltage.

While the industry has come to appreciate that significant voltages are needed to program EEPROMs and significant currents to program flash EEPROMs, there would be a substantial demand for a nonvolatile memory which was both electrically erasable and programmable without the need for relatively higher programming voltages and higher currents.

In many applications, it is desirable for the memory array to be compact so as to increase the number of devices incorporated into a given topology. This can result in decreased size and cost and in some cases higher access speeds. In such compact applications, it may be acceptable to use a process for making the memory arrays that is not compatible with the processes used to make logic devices, because the arrays are formed on a chip that is separate from the logic chip. Thus, it is also desirable, in some situations, to have a compact memory call that also achieves lower programming voltages or currents.

BRIEF DESCRIPTION OF THE DRAWING

FIG. 9 is a cross-sectional view corresponding to FIG. 7 at a subsequent stage of manufacture.

DESCRIPTION OF THE PREFERRED EMBODIMENT

Figure 1:
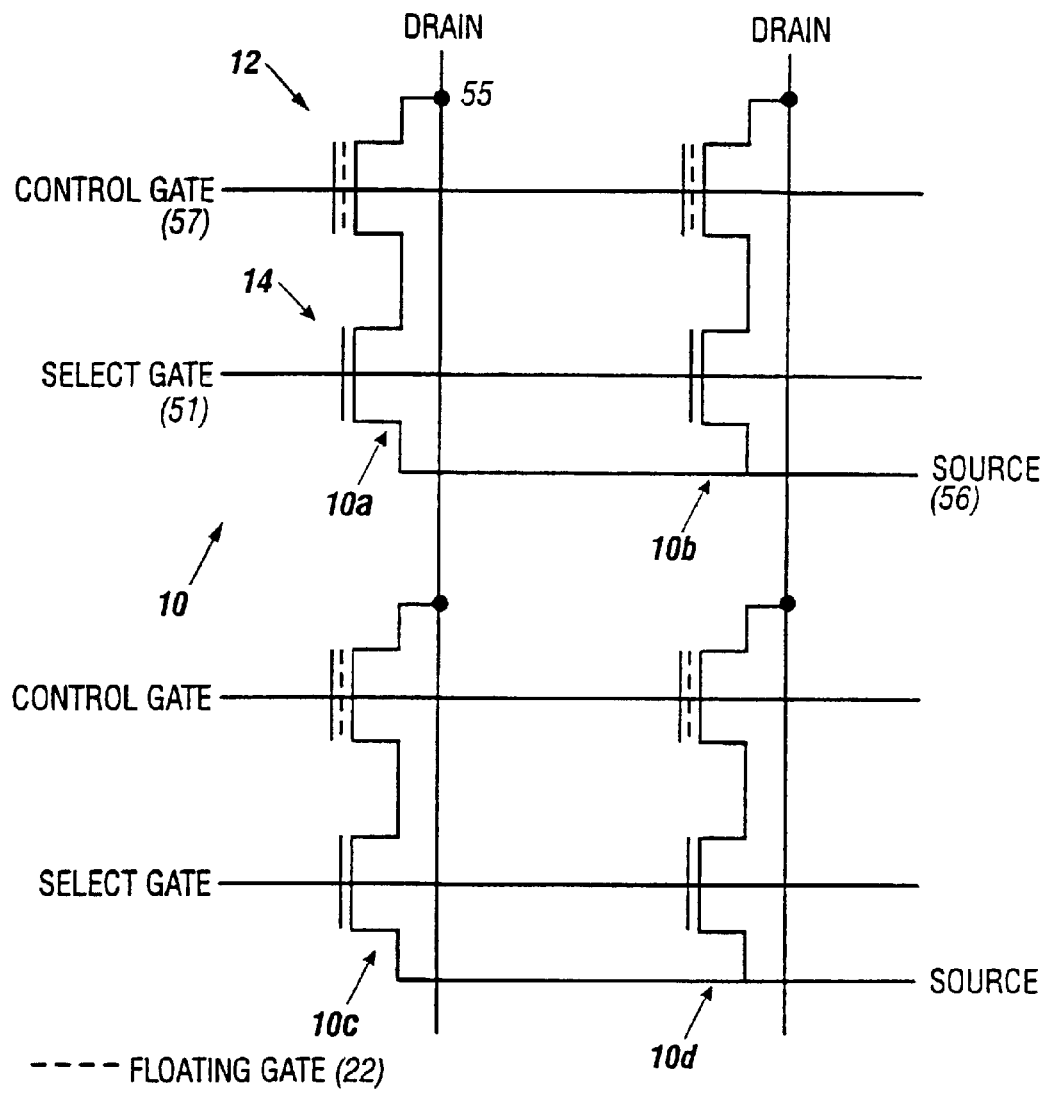
FIG. 1 is a schematic depiction of an array configuration for one embodiment.

Referring to the drawing wherein like reference characters are used for like parts throughout the several views, a memory cell 10, shown in FIG. 1, includes a sense transistor 12 and a select transistor 14. This structure is advantageously implemented on a semiconductor layer having situated thereon an electrically isolated floating gate 22.

For each cell 10a–10d, the source 13 (FIG. 2) of the select transistor 14 is controlled by the source node 56. The select gate of the select transistor 11 is controlled by the node 51. The control gate 17 (FIG. 2) of the sense transistor 12 is controlled by the control node 57. The drain 16 of the sense transistor 12 is connected to the drain node 55.

Figure 2:
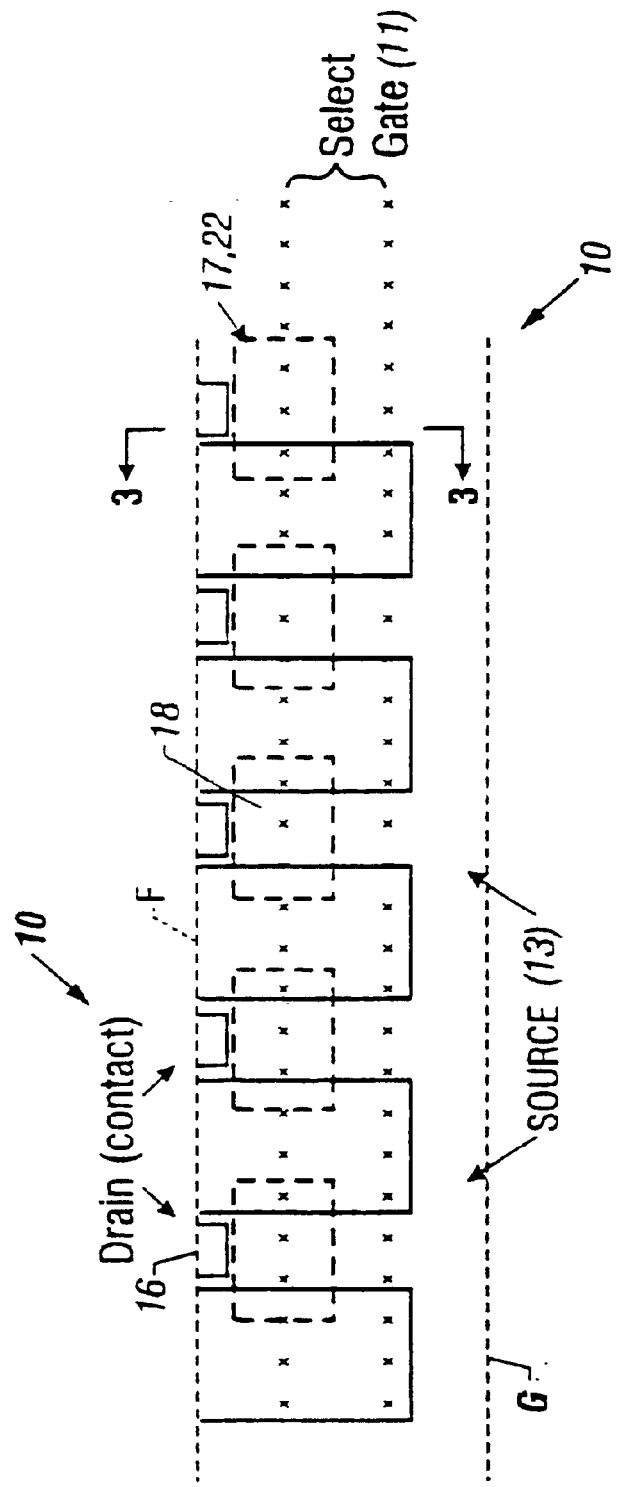
FIG. 2 is an enlarged, top plan view of a row of memory cells in accordance with one embodiment of the present invention.

One layout for implementing a cell 10, shown in FIG. 2, using a triple layer polysilicon technology, includes the control gate 17. The control gate 17 extends across a portion of the active region 18 which is bordered by the drain 16 of the sense transistor 12 and the source 13 of the select transistor 14. The floating gate 22 is situated in isolation under the control gate 17, over the active region 18. The control and floating gates may be arranged in a stack.

Figure 3:
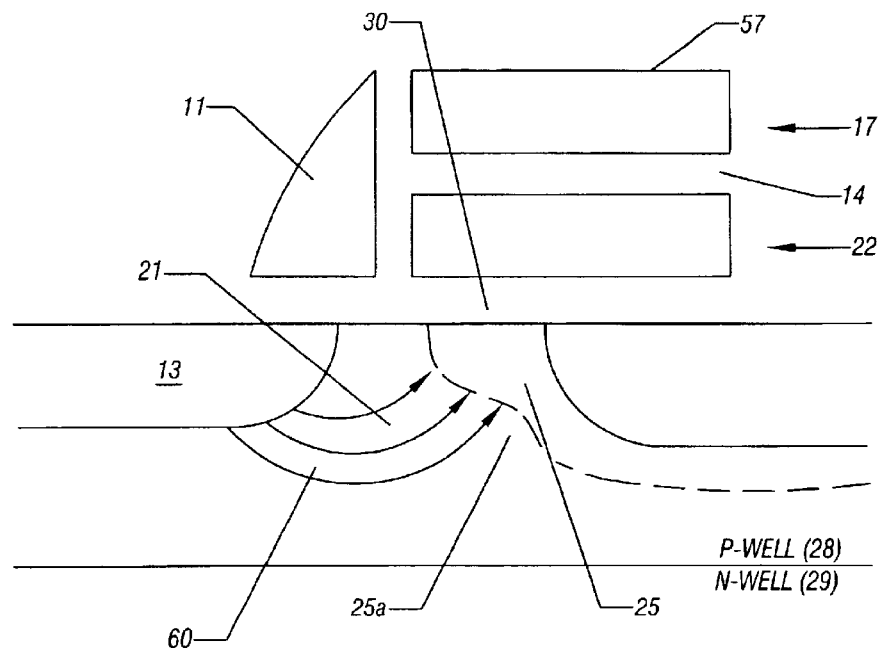
FIG. 3 is a greatly enlarged source to drain cross-sectional view of a cell shown in FIG. 2, taken generally along the line 3—3.

The select gate 11, configured as a split gate, extends along the floating gate 22 as shown in FIG. 3. The select gate 11 is self-aligned. The structure illustrated in FIG. 2 may be duplicated by a folded mirror image arrangement above the fold lines F and G.

The floating gate 22 forms portions of the transistor which has a drain 16 and a source 13. Similarly, the select gate 11 forms the other portion of the transistor between the source 13 and the drain 16. The sense transistor 12 includes a channel 25a while the select transistor 14 includes a channel 21, as shown in FIG. 3. The select gate 11, the floating gate 22 and the control gate 17 form the gates of a transistor with a source 13 and drain 16.

In the illustrated embodiment, the channels 25a and 24 are P-type semiconductor material and are part of a P-well 28. The P-well 28 in turn is formed in an N-well 29. Finally, the N-well 29 is formed in a P-type substrate 38. The P-well 28 may be biased and the N-well 29 may be biased.

The floating gate 22 forms the tunneling capacitor by its interaction with the channel 25a. A tunnel oxide 30 separates the floating gate 22 from the channel 25a. Similarly, the interpoly dielectric oxide 40, which is part of a coupling capacitors, separates the floating gate 22 from the control gate 17. Likewise, the select transistor 14 includes a gate oxide 52, which may be of greater thickness than the tunnel oxide 30.

The cell 10 may be described as a flash EEPROM utilizing high efficiency substrate hot electron injection for programming and Fowler-Nordheim tunneling for erasure. The process of substrate hot electron injection is well describe in T. H. Ning, C. M. Osburn, and H. W. Yu "Emission Probability of Hot Electrons from Silicon into Silicon Dioxide," J. Appl. Phys., vol. 48, p. 286 (1977); Boaz Eitan, James L. McCreary, Daniel Amrany, Joseph Shappir, "Substrate Hot-electron Injection EPROM," IEEE Transactions on Electron Devices, Vol. ED-31, No. 7, p. 934 (July 1984); I. C. Chen, C. Kaya, and J. Paterson, "Band-to-Band Tunneling Induced Substrate Hot-electron (BBISHE) Injection: A New Programming Mechanism for Nonvolatile Memory Devices," IEDM (1989) p. 263; and C. Y. Hu, D. L. Kencke, S. K. Benerjee, "Substrate-current-induced Hot Electron (SCIHE) Injection: A New Convergence Scheme for FLASH Memory," IEDM (1995), p. 283. Each of these articles is hereby expressly incorporated by reference herein.

Programming may be achieved by high afficiency substrate hot carrier injection. As indicated in FIG. 2, substrate electrons, indicated by the arrows at 60, may be generated by forward biasing the source 13 which is separated from the sense transistor 12 channel 25a by the select transistor channel 21. Some of the substrate electrons 60 diffuse through the region underneath the channel 24 to the channel region 25a underneath the sense transistor 12.

For cells that need to be programmed, the channel region 25a may be biased such that a depletion region 25 is formed. When an electron gets to the depletion region 25, it is accelerated by an electric field potential. The electric field potential is the difference between the channel 25a potential (potential of the surface inversion region) and the P-well 28 potential. Some of these electrons gain sufficient energy, in excess of the effective oxide barrier height potential, to be injected onto the floating gate 22.

For cells that are not to be programmed, the channel-to-P-well potential is less than the effective oxide barrier height. In such case, the electrons would not gain sufficient energy to overcome the barrier height and are not injected onto the floating gate 22.

The N+ doped region 13, the P-well 28 and the depiction region 25 under the floating gate 22 form a lateral bipolar transistor 62. The emitter (source 13) of the bipolar transistor 62 acts as a charge injector, injecting substrate electrons from the source diffusion to the biased depletion region under the floating gate 22. With the diffusion 13 as the emitter and the channel 24 as the base, the collector is the biased depletion region 25. Since the channel region 25a acts as the channel for the sense transistor during read, and the biased depletion region 25 under the sense transistor 12 acts as the collector of the bipolar transistor during programming, a compact cell layout is achieved.

Advantageously, page programming is utilized to program a page of cells at one time from a common source injector. This avoids wasted programming current that would result from raising an entire column of cells to the programming voltage, including cells that were not selected to be programmed. The charge injection from the source is advantageously achieved by charge injected in the source-to-drain axis of the cell as well as from regions of the source that extend outwardly beyond the channel width of the cell, as indicated by the arrows in FIG. 2. This increases the programming current.

It is advantageous that the carrier injection be accomplished without intervening carrier traps between the source and the depletion region. This improves the injection efficiency of the lateral bipolar transistor.

In the illustrated embodiment, one injector is provided for each cell, even though the bipolar transistors forming the injectors for a plurality of cells have a common emitter. It is advantageous that all of the injectors have a controlled length(source-to-channel) so that the rate of charge injection is substantially the same for each cell.

The efficiency of substrate hot electron injection is a function of a number of characteristics. Considering the depletion region 25, electrons scatter with lattice phonon scattering across the depletion region 25 with a certain electron mean free path. Some of these electrons, without much scattering, gain sufficient energy to overcome the effective barrier height and are injected onto the floating gate 22. Some electrons gain less energy than the effective barrier height and are not injected onto the floating gate 22. The injection efficiency is a strong function of the doping concentrations and the channel-to-P-well potential.

Since the cell 10 is situated in a P-well 28 embedded in an N-well 29, during programming the floating gate 22 is capacitively coupled to a higher voltage through the coupling capacitor 32 by raising the control gate 17 to Vpp, which may be from 7 to 14 volts. The voltage that the floating gate 22 attains at low drain bias is approximately a function of the voltage on the floating gate when the control gate 17 and the P-well 28 and drain 16 are at ground, plus the coupling ratio times the voltage on the control gate 17. The coupling ratio, to a first order, is approximately equal to the capacitance of the capacitor 32 divided by the sum of the capacitances of the coupling capacitor 32 and the tunneling capacitor 33.

When the select transistor 14 is off, the sense transistor drain 16 potential can be forced close to the supply potential Vcc or higher. Since the select transistor 14 is off, the potential of node 51 follows the channel 25a potential. The channel 25a potential, which is the potential of the surface inversion region of the channel region 25a, is set as follows. When the potential of the floating gate 22 (Vfg) is one sense transistor 12 threshold voltage higher than the drain 16 potential, the channel potential is the same as the drain potential. On the other hand, when the floating gate 22 potential is less than the drain 16 potential plus the sense transistor 12 threshold voltage, the channel potential is the difference between the floating gate 22 voltage and the sense transistor 12 threshold voltage.

The P-well potential is the voltage applied to the P-well 28. Since the P-well 28 is embedded in an N-well 29, and the N-well is set at a voltage of approximately Vss or higher, the P-well potential Vp can be Vss or negative, typically negative one to negative two volts. Moreover, it is usually less than the effective oxide barrier height to avoid any potential disturb problem.

The potential difference between the channel 25a region and the P-well 28 potential (Vp) is the voltage across the depletion region 25. For cells to be programmed, the drain 16 voltage is raised high, typically close to Vcc or higher. A depletion region 25 in the channels 25a and 24 underneath the sense transistor 12 is formed with a voltage drop equal to the channel potential minus the P-well potential.

For those cells that are not to be programmed, the drain 16 voltage is set to zero volts (Vss). The voltage drop across the depletion region 25 then is equal to the absolute value of Vp, which is typically less than the effective oxide barrier height.

Cell 10 erasure is achieved by Fowler-Nordheim tunneling of electrons from the floating gate 22 to the channel region 25a and the drain diffusion 16. During erasure, the control gate 17 is forced to a negative voltage from −7 to −14 volts, for example. As for the drain diffusion 16, the P-well 28, and the N-well 29, they are biased to a positive potential close to Vcc or higher. Vcc is determined by the particular technology utilized. For example, it could be 5.0 to 1.8 volts with present technologies. This reduces the electric field across the junction between the N+ diffusion 16 and the P-well 28. The reduced field prevents acceleration of hot hole trapping in the gate oxide under the floating gate 22.

The drain 16 is preferably not biased to a voltage higher than the P-well 28 to such an extent that gate induced rain leakage (GIDL) becomes a problem. With current technologies, this means that the drain 16 bias cannot be higher than the P-well 28 bias by a few volts. In addition, if the drain 16 bias significantly exceeds the P-well 28 bias, hot hole trapping may occur in the sense gate oxide 30 due to the lateral junction field acceleration.

The ability to apply a positive voltage to the P-well arises because the P-well 28 is embedded in an N-well 29. The P-well voltage is preferably equal to or less than N-well potential to avoid P-well/N-well forward biasing. Thus, applying a position voltage of Vcc or higher to the P-well, N-well and the drain 16 can eliminate hot hole trapping induced by GIDL while allowing the drain 16 voltage to be raised to Vcc or higher.

The voltage across the capacitor 33 is the difference between the floating gate 22 potential on the one hand and the diffusion 16 and the P-well 28 potentials. When the difference exceeds 8 to 10 volts, sufficient tunneling current is generated and the floating gate 22 can be erased to a negative potential in the time frame of a few milliseconds to a few seconds, depending on the tunneling oxide 30 thickness.

Electrons tunnel to the drain region 16 (drain erase). The tunneling current depends on the voltage from the floating gate 22 to the drain 16.

Reading the programming state of the cell 10 may be accomplished as follows. The floating gate 22 is capacitively coupled to a higher potential by forcing the control gate 17 to a positive potential, for example, of 2.5 to 5 volts. The floating gate 22 is coupled to a potential Vfg which can be calculated as being equal to the sum of the floating gate potential when the control gate 17 is held at ground, plus the potential on the control gate 17 times the coupling ratio.

The drain 16 potential during reading is limited to a voltage of less than 2 volts. This is to avoid any read disturb.

For the selected cell to be read, the select gate 11 is forced to Vcc, and the source 13 is forced to ground. The unselected select gate 11 is also forced to ground.

When these potentials are applied to the selected cell 10, a current flows through the sense transistor 12. This current is then fed to a current sense amplifier (not shown). If the voltage on the floating gate 22 is grater than the threshold voltage on the sense transistor 12, a higher current, perhaps greater than 20 microamps, is detected as the conducting state. When the potential of the floating gate is less than the threshold voltage, a lower current, for example, less than one microamp flows, and a nonconducting state is detected.

A detected conducting state can be called a one state. A nonconducting state can be called the zero state.

An example of the operation of the cell in programming, reading and erasing is summarized in the following chart:

| | Cell Operation | | | | | |
|---|---|---|---|---|---|---|
| | (Selected) | (Unselected) | (Selected) | (Unselected) | (Selected) | (Unselected) |
| Drain (55) | Vcc | *0 or Vcc | Vcc | *0 or Vcc | −1.5 V | *0 or −1.0 V |
| Source (56) | Float | Float | Vs | Float | Vss | Vss |
| Select (51) | Vss | Vss | Vss to Vs | Vss to Vs | Vcc | Vss |
| Control (57) | −7 to 14 V | Vss | Vpp | Vss | 2 to 5 V | Vss |
| N-well (29) | Vcc | Vcc | Vcc to Vss | Vcc to Vss | Vcc | Vcc |
| P-well (28) | Vcc | Vcc | Vbias | Vbias | Vss | Vss |

*0 is for unselected column.
Vpp = 7 to 14 volts.

Vs is the node voltage set by the injection current level, ranging from a few tens of nanoamps to a few tens of microamps depending on the programming speed requirement. Typically, it would be from tens of milliseconds to tens of microseconds. Vbias is the bias on the P-well 28 which can be Vss or it can be forced to −1 to −2 volts to enhance injection efficiency. Vss is the external ground potential.

A suitable on-chip circuit for generating two negative bias potentials, one to bias the control gate 17 and the other to negatively bias the P-well 28, can be found in L. A. Glasser and D. W. Dobberpuhl, "The Design and Analysis of VLSI Circuits," (December 1985), published by Addison-Wesley, at pages 301–329, hereby expressly incorporated by reference herein.

While the cell 10 may be utilized as a single element, it can also be connected as an array as shown in FIG. 1. In the array, a plurality of cells 10, 10a, 10b, 10c, 10d are depicted. The source node 13 is formed by connecting all of the source nodes of cells in the same row as one single node 56. The control node 57 is formed by connecting all the control nodes of the individual cells in the same row together as a single node 57. The select gate node 11 is formed by connecting the select gate nodes for all the cells on the same row together as one node 51. Similarly, the drain node 16 is formed by connecting all the drain nodes for cells in the same column together as a single node 55. This node leads to the sense amplifier (not shown).

Figure 4:
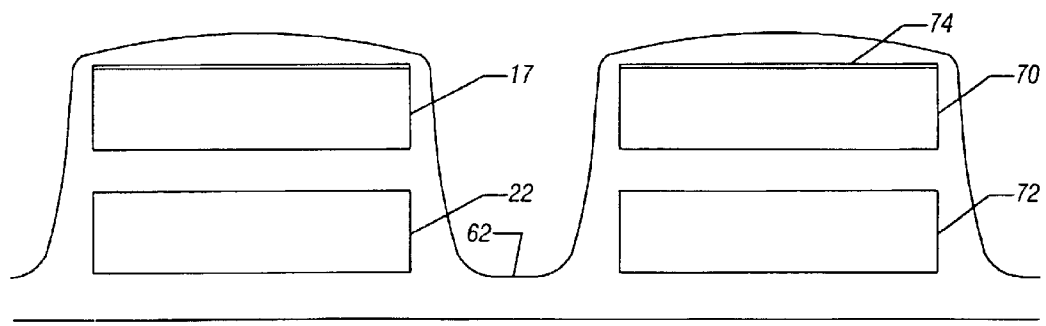
FIG. 4 is a cross-sectional view of another embodiment at an early stage of manufacture.
Figure 5:
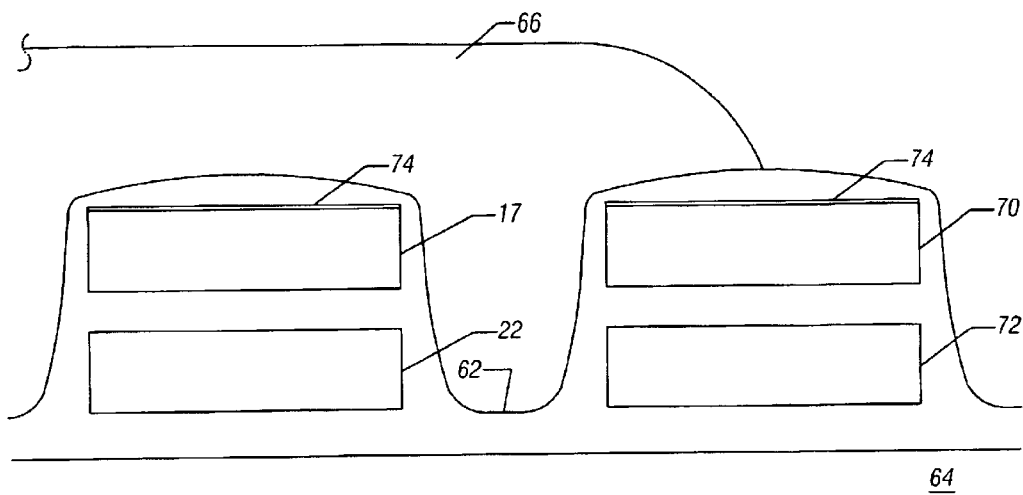
FIG. 5 is a cross-sectional view corresponding to FIG. 4 at a subsequent stage of manufacture.

Referring to FIG. 4, the stacked gate structure, including the gates 17 and 22, may be covered by an insulator 62. An adjacent stacked gate structure including gates 70 and 72 may be formed proximate to the stacked gate structure including the gates 17 and 22. Thus, the insulator 62 not only covers the stacked gates 17 and 22, but also the stacked gates 70 and 72. Referring to FIG. 5, a portion of the stacked gates 70 and 72 and the stacked gates 17 and 22 may be covered by a mask 66 that may be photoresist.

Figure 6:
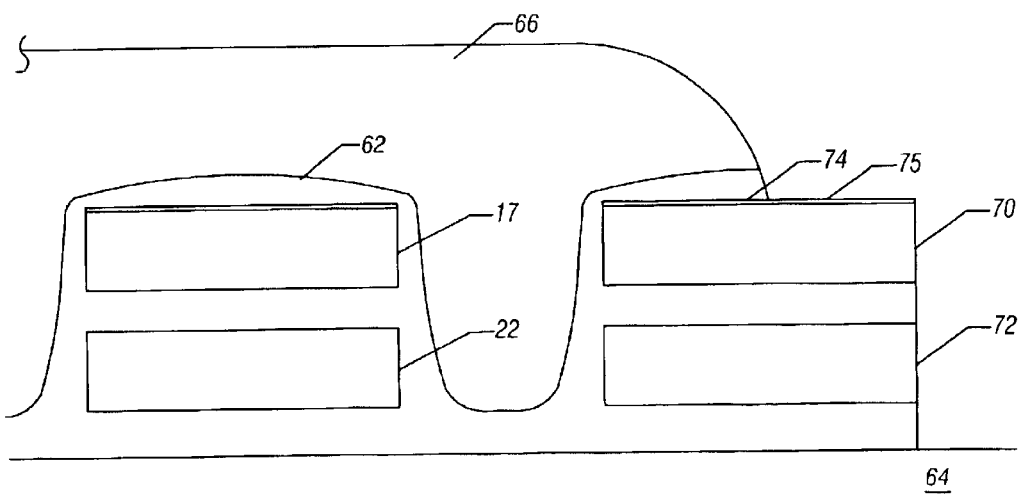
FIG. 6 is a cross-sectional view corresponding to FIG. 5 at a subsequent stage of manufacture.

Referring to FIG. 6, the upper gate 70 may be covered with an insulator 74, such as nitride, in one embodiment of the present invention. A portion of the insulator 74 and the side edges of the gates 70 and 72 may be exposed by etching away the portion of the insulator 62 not covered by the mask 66.

Figure 7:
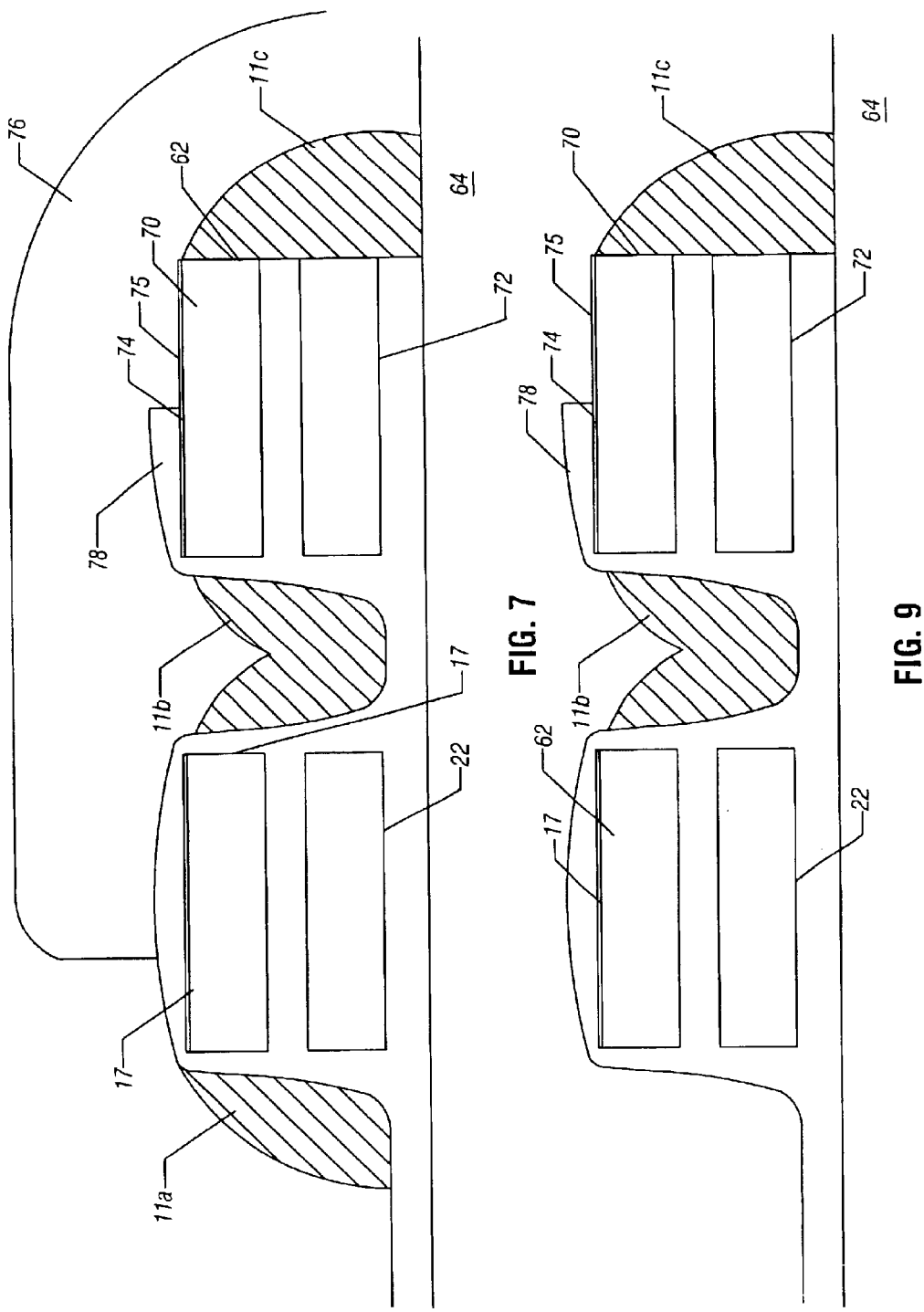
FIG. 7 is a cross-sectional view, taken along the line 7—7 in FIG. 8, corresponding to FIG. 6 at a subsequent stage of manufacture.

Referring to FIG. 7, the structure with the mask 66 removed may be coated with a conductive material that may be deposited over the structure shown in FIG. 6, in accordance with one embodiment of the present invention. After the conductive material is deposited, it may be partially etched away, for example, using an anisotropic etch, to leave the spacers 11a and 11b and 11c. The conductive material may be polysilicon in one embodiment of the present invention.

Figure 8:
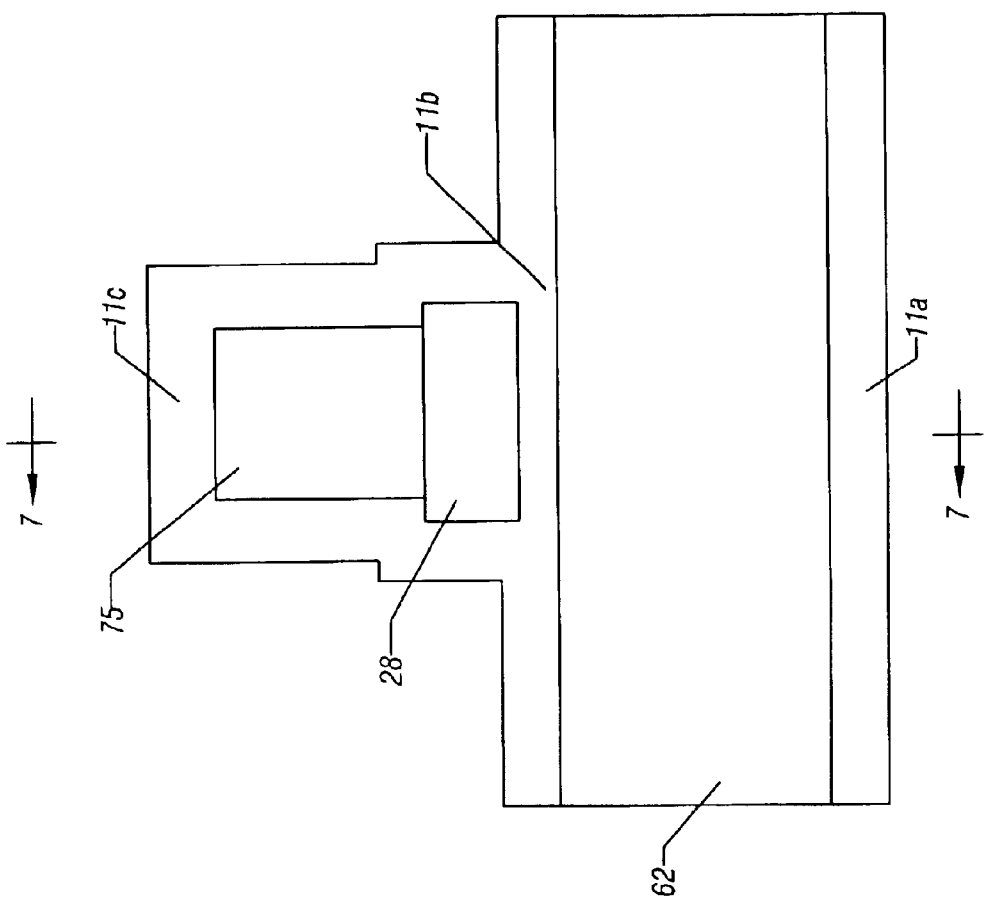
FIG. 8 is a top plan view corresponding to FIG. 7 in one embodiment of the present invention.

Because of the close proximity of the stacks of gates 17 and 22 and 70 and 72, the etched, deposited conductive material may form a V-shaped spacer 11b as shown in FIG. 7 in the middle and the sidewall spacers 11a and 11c on the ends. The spacer 11c is directly abutted against the gates 70 and 72. As shown in FIG. 8, the v-shaped spacers 11b and 11c are part of the same spacer and are electrically connected.

Then the stack consisting of the gates 70 and 72 and a portion of the stack consisting of the gates 17 and 22 may be covered with a photoresist layer 76. The photoresist layer 76 may be utilized to remove the sidewall spacer 11a.

The resulting structure, as shown in FIG. 9, uses the stack of gates 70 and 72 and the sidewall spacer 11c as an enlarged contact area to facilitate contacting to the structure including the gates 17 and 22. For example, contacts can be placed on the surface 75 and those contacts may overlap onto the sidewall spacer 11c. Any such contact makes contact to the gates 70 and 72, which in turn may be electrically connected to the spacer 11b and the gates 17 and 22.

The insulator 74 is optional and may be used in cases where the etch selectivity between the insulator 62 and the gate 70 is not good enough. The insulator 74 may also protect the gate 70 in case the insulator 62 has to be etched away to leave the exposed surface 75.

While a number of parameters and levels were provided in the foregoing description, those skilled in the art will appreciate that these parameters and levels are merely for illustration purposes. For example, by reversing the conductivity types of the doped junctions and the bias polarities, a cell structure using substrate hot hole injection may be implemented. It is intended that the appended claims cover all modifications and variations as fall within the true spirit and scope of the present invention.

What is claimed is:

1. A method comprising:

forming a pair of stacked gates including a control gate and a floating gate;

forming a pair of self-aligned sidewall spacers on said gates;

removing one of said sidewall spacers; and forming a bipolar transistor to inject substrate hot carriers onto the floating gate.

2. The method of claim 1 including forming a select transistor whose gate is said remaining sidewall spacer.

3. The method of claim 1 including forming a lateral bipolar transistor.

4. The method of claim 1 including forming a select transistor having a source, said source also acting as the injector to inject substrate hot carriers onto the floating gate.

* * * * *